United States Patent
Throngnumchai

(10) Patent No.: US 6,788,088 B2
(45) Date of Patent: Sep. 7, 2004

(54) SEMICONDUCTOR DEVICE EQUIPPED WITH CURRENT DETECTION FUNCTION

(75) Inventor: Kraisorn Throngnumchai, Yokohama (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 10/394,029

(22) Filed: Mar. 24, 2003

(65) Prior Publication Data

US 2003/0184326 A1 Oct. 2, 2003

(30) Foreign Application Priority Data

Apr. 1, 2002 (JP) .................................... 2002-098750

(51) Int. Cl.⁷ ............................................. G01R 31/02

(52) U.S. Cl. .................... 324/763; 388/907.2; 324/126

(58) Field of Search ............................ 324/126, 158.1, 324/763, 765; 318/490; 388/907.2

(56) References Cited

U.S. PATENT DOCUMENTS 5,644,484 A * 7/1997 Elango ........................ 363/98
5,844,743 A * 12/1998 Funches .................. 360/78.04

FOREIGN PATENT DOCUMENTS

JP          8-84060         3/1996
JP          P2001-16865 A   1/2001

* cited by examiner

Primary Examiner—Evan Pert
Assistant Examiner—Russell M Kobert
(74) Attorney, Agent, or Firm—McDermott Will & Emery LLP

(57) ABSTRACT

While a power transistor which is positioned in an upper arm with respect to an inductive load and a power transistor which is positioned in a lower arm are both controlled to be OFF by a controller, reverse currents flowing in current mirror circuits which respectively correspond to these power transistors positioned in the upper arm and the lower arm are detected by current detectors. Since the currents which flow in the current mirror circuits are proportional to the currents which flow in the power transistors provided corresponding thereto, it is possible to detect the load current based upon the reverse currents which are detected by the current detectors.

9 Claims, 7 Drawing Sheets

SEMICONDUCTOR DEVICE EQUIPPED WITH CURRENT DETECTION FUNCTION

BACKGROUND OF THE INVENTION

1. Field of the Invention

The present invention relates to a semiconductor device which controls to drive an inductive load such as an AC motor or the like, and in particular relates to a semiconductor device which is equipped with a function of detecting the current which flows through an inductive load.

2. Description of the Related Art

With a semiconductor device which controls to drive an inductive load such as an AC motor or the like, in order to control the current which flows through the inductive load (hereinafter termed the "load current"), it is necessary to detect the value of this load current. In Japanese Laid-Open Patent Publication No. 2001-16865, there is disclosed a method for detecting such a load current using a current sensor. However, it is not possible to satisfy demands for reduction in the cost and the size of such a semiconductor device, since generally the cost of a current sensor is high, and moreover its size cannot be ignored.

Furthermore, in FIG. 7 of the above identified publication NO. 2001-16865, a method is disclosed of detecting the load current by using current mirrors of several power transistors which make up an inverter device. FIG. 7 of this application is a figure showing a circuit for one phase of an inverter device based upon this prior art method. IGBT (Insulated Gate Bipolar Transistor) 1 through IGBT 4 are used as the power transistors, and IGBT 3 is a current mirror for IGBT 1, while IGBT 4 is a current mirror for IGBT 2. The current which flows in IGBT 3 and IGBT 4 can be detected by current detectors 5 and 6. These current detectors 5 and 6 comprise respective resistors for current detection R1 and R2 and operational amplifiers (hereinafter termed the "op-amp") 5a and 6a. The current which flows in IGBT 3 and IGBT 4 is detected respectively by detecting the electric potential difference between the ends of the resistors R1, R2 with the op-amp circuits 5a and 6a.

With the circuit shown in FIG. 7, in the state in which the upper side IGBT 1 and IGBT 3 are OFF, and when IGBT 2 and IGBT 4 are respectively ON, the load current flows in the IGBT 2 and IGBT 4 in the directions shown by the arrows Y3 and Y4 respectively. Since the current which flows in the IGBT 4 is proportional to the current which is flowing in the IGBT 2, it is possible to detect the current which flows in the IGBT 2 and the IGBT 4, in other words the load current, by detecting the current which flows in the IGBT 4 with the current detector 6.

SUMMARY OF THE INVENTION

However, the following problems are present with the method of detecting the load current by using the circuit shown in FIG. 7. In detail, when the load current flows in the direction shown by the arrow Y3 and Y4 and when the lower side IGBT 2 and IGBT 4 are turned OFF, the load current flows through a free wheel diode D1. Next, when the lower side IGBT 2 and IGBT 4 go to ON, the load current again flows in the directions shown by the arrows Y3 and Y4. Since a reverse recovery current flows in the direction shown by the arrow Y2 during the reverse recovery period of the free wheel diode D1, it may happen that such a reverse recovery current in addition to the load current flow in IGBT 2 and IGBT 4. Accordingly, the current detected by the current detector 6 is not proportional to the current which flows in the load 30, and it becomes impossible to measure the load current accurately.

It would be desirable to provide a semiconductor device equipped with a current detection function, which is capable of detecting the current which flows in an inductive load accurately.

A semiconductor device equipped with a current detection function according to the present invention comprises a first power transistor which is positioned in an upper arm side with respect to an inductive load and which supplies drive current in a first direction, a first current adjustment device which causes current to flow in the direction opposite to the first direction with respect to the first power transistor, a first current mirror circuit through which flows a current proportional to the current which flows in the first power transistor, a first current detection device which detects the current flowing in the opposite direction in the first current mirror circuit, a second power transistor, connected in series with the first power transistor which is positioned in a lower arm side with respect to the inductive load and which supplies drive current in a second direction which is different from the first direction, a second current adjustment device which causes current to flow the direction opposite to the second direction with respect to the second power transistor, a second current mirror circuit through which flows a current proportional to the current which flows in the second power transistor, a second current detection device which detects the current flowing in the opposite direction in the second current mirror circuit and a drive device which drives the first power transistor and the second power transistor. In this semiconductor device equipped with a current detection function, a current which is flowing in the inductive load is detected based upon a reverse direction current which is detected by at least one of the first current detection device and the second current detection device while the first power transistor and the second power transistor are both being controlled to be OFF by the drive device.

DETAILED DESCRIPTION OF THE PREFERRED EMBODIMENTS

The First Preferred Embodiment

Figure 1:
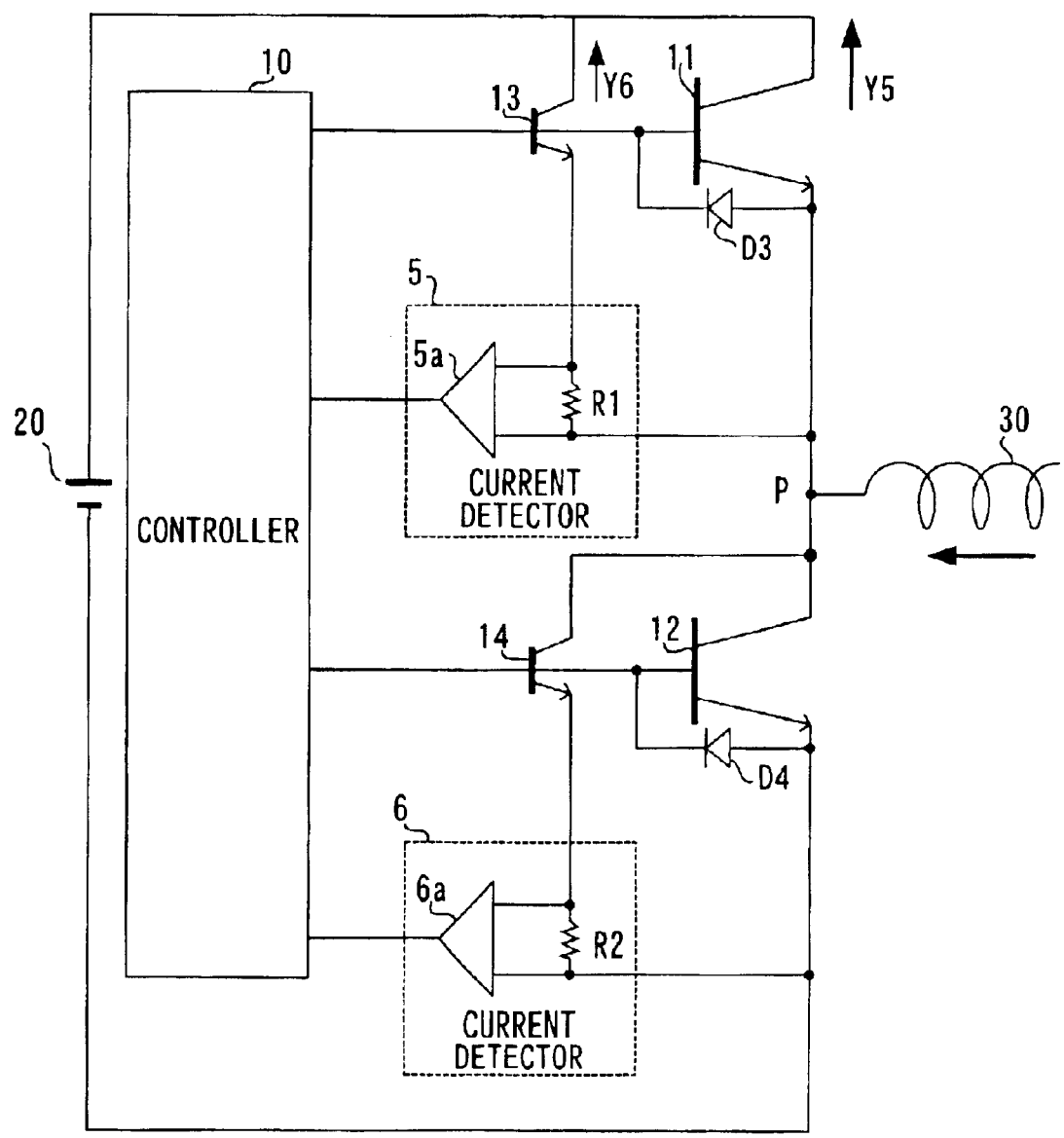
FIG. 1 is a figure showing the structure of a semiconductor device equipped with a current detection function according to the first preferred embodiment of the present invention.

FIG. 1 is a figure showing the structure of the first preferred embodiment of the semiconductor device equipped with a current detection function according to the present invention, which is a portion of an H bridge circuit for controlling an inductive load. The inductive load 30 may be, for example, an AC motor which is used for driving a hybrid vehicle or an electric vehicle. In other words, FIG. 1 shows one phase of a three phase inverter circuit for converting DC electrical power from a DC power source 20 into AC electrical power and supplying this electrical power to the inductive load 30.

An NPN transistor 11 and an NPN transistor 12 are bipolar type power transistors which respectively constitute an upper arm and a lower arm of the H bridge circuit. The transistor 11 and the transistor 12 are connected in series, and the inductive load 30 is connected between the emitter terminal of the transistor 11 and the collector terminal of the transistor 12 which are connected in series. The collector terminal of the transistor 11 is connected to the positive electrode side of the DC power source 20, and the emitter terminal of the transistor 12 is connected to the negative electrode side of the DC power source 20 (i.e. to ground).

Figure 7:
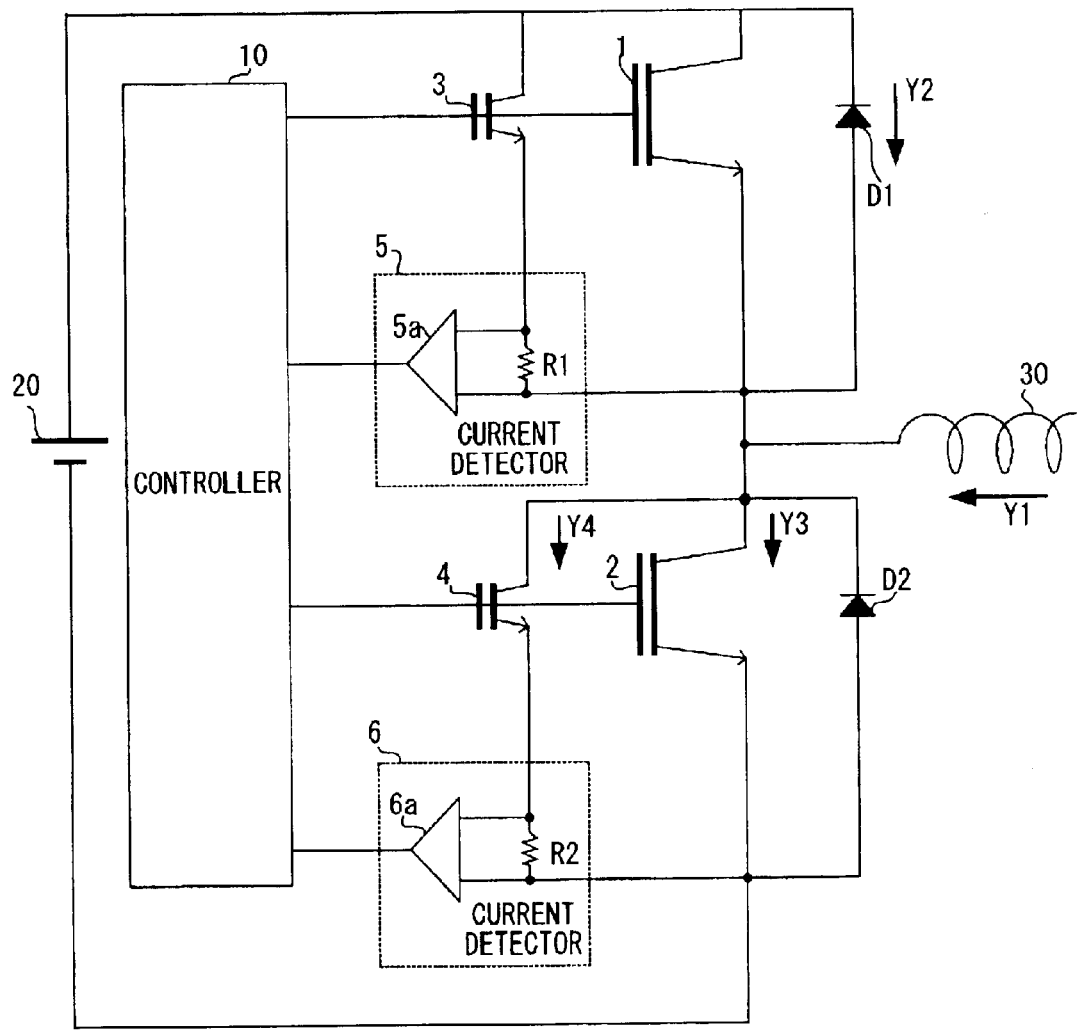
FIG. 7 is a figure showing a circuit of a single phase of an inverter device for detecting load current according to the prior art.

In the same manner as in FIG. 7, a transistor 13 functions as a current mirror for the transistor 11, and a transistor 14 functions as a current mirror for the transistor 12; bipolar type power transistors are used for both of these transistors 13 and 14. Accordingly the transistors 11 and 13 have the characteristic that they are both ON or OFF together; and similarly the transistors 12 and 14 have the characteristic that they are both ON or OFF together. Moreover, all of the transistors 11 through 14 are controlled by a controller 10 which is connected to the base terminals of these transistors 11 through 14, and they are repeatedly turned ON and OFF at a predetermined fixed period.

A diode D3 is connected between the base terminal and the emitter terminal of the power transistor 11, so that current can flow only from its emitter terminal towards its base terminal. In the same manner, a diode D4 is connected between the base terminal and the emitter terminal of the power transistor 12, so that current can flow only from its emitter terminal towards its base terminal. The transistors 11 and 12 can be turned ON in the reverse direction by current due to a back electromotive force which is generated by the inductive load 30 flowing in the diodes D3 and D4 respectively. For example when, from the state in which the transistor 11 is OFF and the transistor 12 is ON, the transistor 12 is turned OFF by the controller 10, then the back electromotive force is generated from the inductive load 30, and a current flows to the base terminal of the transistor 11 via the diode D3. Due to this, the transistor 11 goes into the reverse continuous state in which a current flows in the direction of the arrow Y5 from its emitter terminal towards its collector terminal. In this specification, we term the current flowing in the direction of the arrow Y5 while the transistor 11 is in the reverse continuous state "reverse current". In the same manner, the transistor 13 also goes into the reverse continuous state, and a reverse current flows in this transistor 13.

The above described operation is the same for the transistors 12 and 14. In other words when, from the state in which the transistor 12 is OFF and the transistor 11 is ON, the transistor 11 is turned OFF by the controller 10, the transistors 12 and 14 go into the reverse continuous state, and a reverse current flows in the transistors 12 and 14.

The current detectors 5 and 6 comprise resistors for current detection R1 and R2 and op-amp circuits 5a and 6a, and they detect the reverse currents which flow when the transistors have gone into the reverse continuous state. In other words, the current detectors 5 and 6 detect the reverse current which flows in the transistors 13 and 14 by detecting, using the op-amp circuits 5a and 6a, the electric potential difference between the two ends of the resistors R1 and R2. The values detected for the currents are inputted to the controller 10.

It is to be noted that, since the electric potential differences between the bases and the emitters of the transistors are quite small, generally the current is detected by taking the electric potential of the emitter as a standard potential. In other words, the current detectors 5 and 6 are respectively provided upon the emitter terminal sides of the transistors 13 and 14, since, if they were provided on the collector sides thereof, they would be required to have high voltage capability.

This semiconductor device equipped with a current detection function according to this first preferred embodiment detects the load current by detecting, with the current detectors 5 and 6, the reverse currents which flow when the transistors 13 and 14 are in their reverse continuity states. For example, if the transistors 11 and 13 go into their reverse continuity states, the load current which flows in the load 30 entirely flows through the transistors 11 and 13, and does not flow through the transistors 12 and 14. Furthermore, since the transistor 13 is a current mirror for the transistor 11 and so the current which flows in the transistor 13 is proportional to the current which flows in the transistor 11, accordingly, by detecting the reverse current which flows in the transistor 13 with the current detector 5, it is possible accurately to measure the total current which flows in the transistor 11 and the transistor 13, in other words, the load current.

Figure 2:
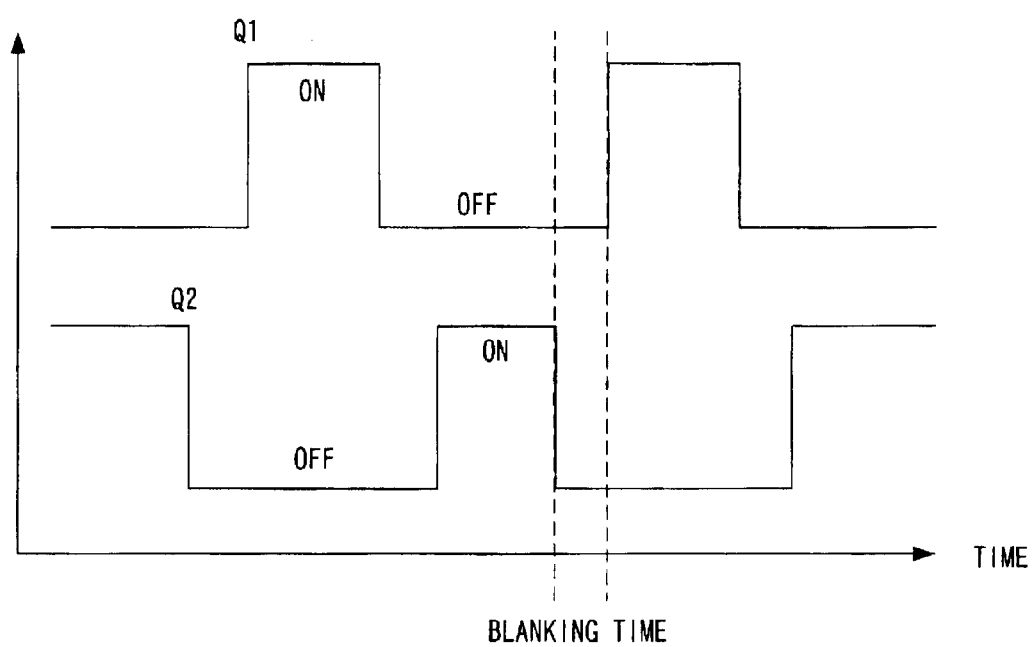
FIG. 2 is a figure showing an ON/OFF signal for controlling a transistor.

FIG. 2 is a figure showing an ON/OFF signal for controlling the transistors 11 through 14. In a single control period, each of the transistors 11 and 13, and the transistors 12 and 14, goes ON once. The control signal is shown over two control periods in FIG. 2: Q1 shows a signal for controlling the transistors 11 and 13, while Q2 shows a signal for controlling the transistors 12 and 14.

As shown in FIG. 2, with the semiconductor device equipped with a current detection function according to this first preferred embodiment, a time period is provided in which all of the transistors 11 through 14 are controlled so as to be turned OFF. This time period is termed the "blanking time period" or "dead time period", and is provided in order to protect against a large piercing current flowing, which might happen if the transistors 11 and 13 and the transistors 12 and 14 were to go ON at the same time. Accordingly, during this blanking time, due to the ON/OFF action of the transistors 11 through 14, the load current flows as reverse current either in the transistors 11 and 14, or in the transistors 12 and 14. Accordingly, with the semiconductor device equipped with a current detection function according to this first preferred embodiment, the load current is accurately measured during this blanking time by detecting this reverse current.

The Second Preferred Embodiment

Figure 3:
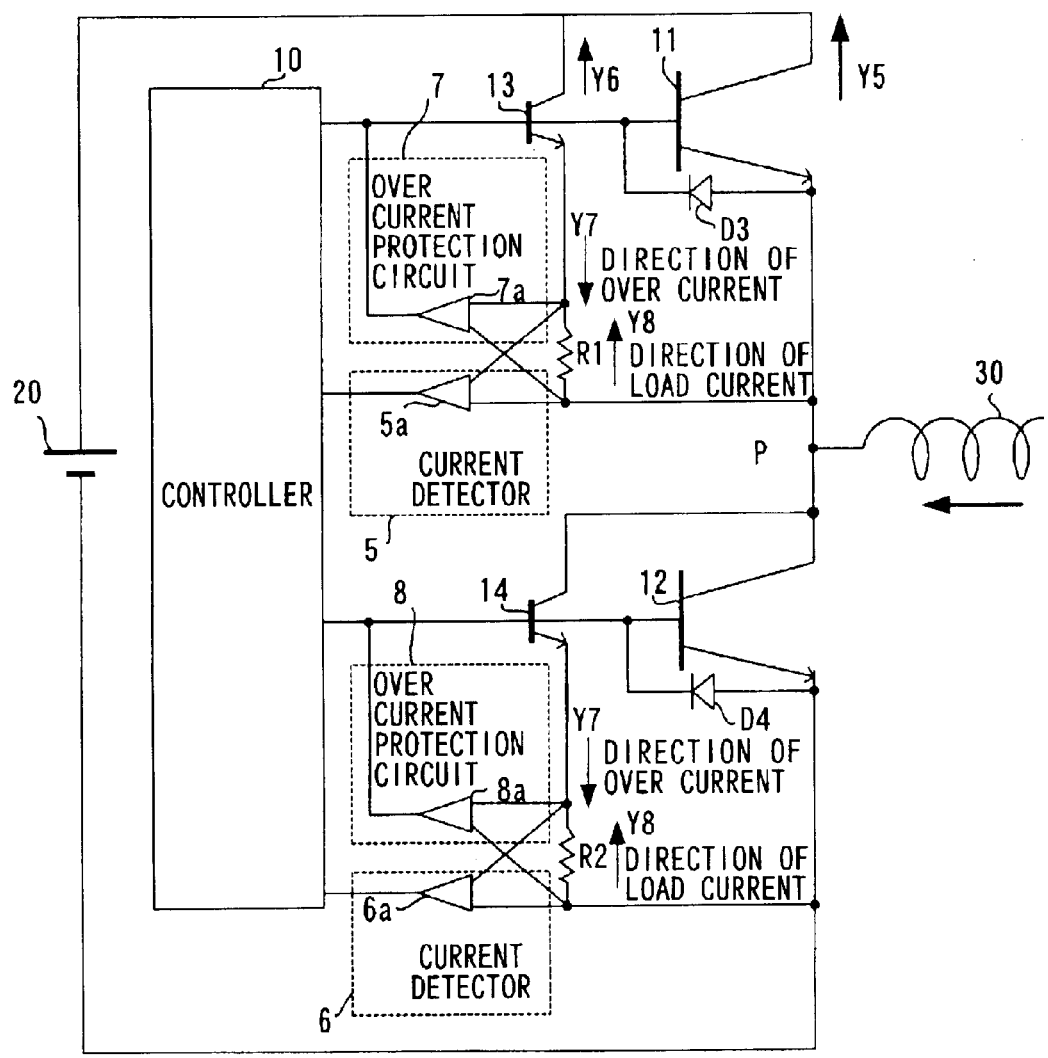
FIG. 3 is a figure showing the structure of a semiconductor device equipped with a current detection function according to the second preferred embodiment of the present invention.

FIG. 3 is a figure showing the structure of the second preferred embodiment of the semiconductor device equipped with a current detection function according to the present invention. This semiconductor device equipped with a current detection function according to the second preferred embodiment has the same structure as does the semiconductor device equipped with a current detection function according to the first preferred embodiment shown in FIG. 1, with the addition of two over current protection circuits 7 and 8. Current mirrors are provided for the power transistors in order to prevent the flow of over current. With this semiconductor device equipped with a current detection function according to the second preferred embodiment, the current mirrors 13 and 14 for measuring the load current and the resistors for current detection R1 and R2 are also used in circuits for preventing the flow of over current.

Op-amp circuits 7a and 8a are used in the over current protection circuits 7 and 8, and these are able to detect the current which flows in the forward directions of the power transistors 13 and 14 by detecting the electric potential differences between the two ends of the resistors R1 and R2. The output terminals of the over current protection circuits 7 and 8 are respectively connected to the base terminals of the power transistors 13 and 14, and accordingly, a negative feedback circuit is implemented using the over current protection circuits 7 and 8. In other words, the base currents of the transistors 13 and 14 are adjusted according to the magnitudes of the currents which flow in the direction of the arrows Y7 in the transistors 13 and 14, so that over current is prevented from flowing in the transistors 13 and 14.

As described above, by contrast to the current detector 5 which detects the reverse current flowing in the direction of the arrow Y8 during the blanking time (the reverse direction), the over current protection circuit 7 operates when the transistor 13 turns ON and current flows in the direction shown by the arrow Y7 (the forward direction). Accordingly, as shown in FIG. 3, although the transistor 13 which is a current mirror and the resistor for current detection R1 are used in both the current detector 5 and in the over current protection circuit 7, no problem occurs with this dual operation, because the time period in which they operate in these individual circuits are different. This is also the same for the current detector 6 and the over current protection circuit 8.

According to this semiconductor device equipped with a current detection function according to the second preferred embodiment, it is possible to attain a reduction in cost and also in space utilization for the semiconductor device as a whole, since, in order to implement both the circuit for measuring the load current and also the circuit for over current protection, certain components are used in common as structural elements in both of these circuits.

The Third Preferred Embodiment

Figure 4:
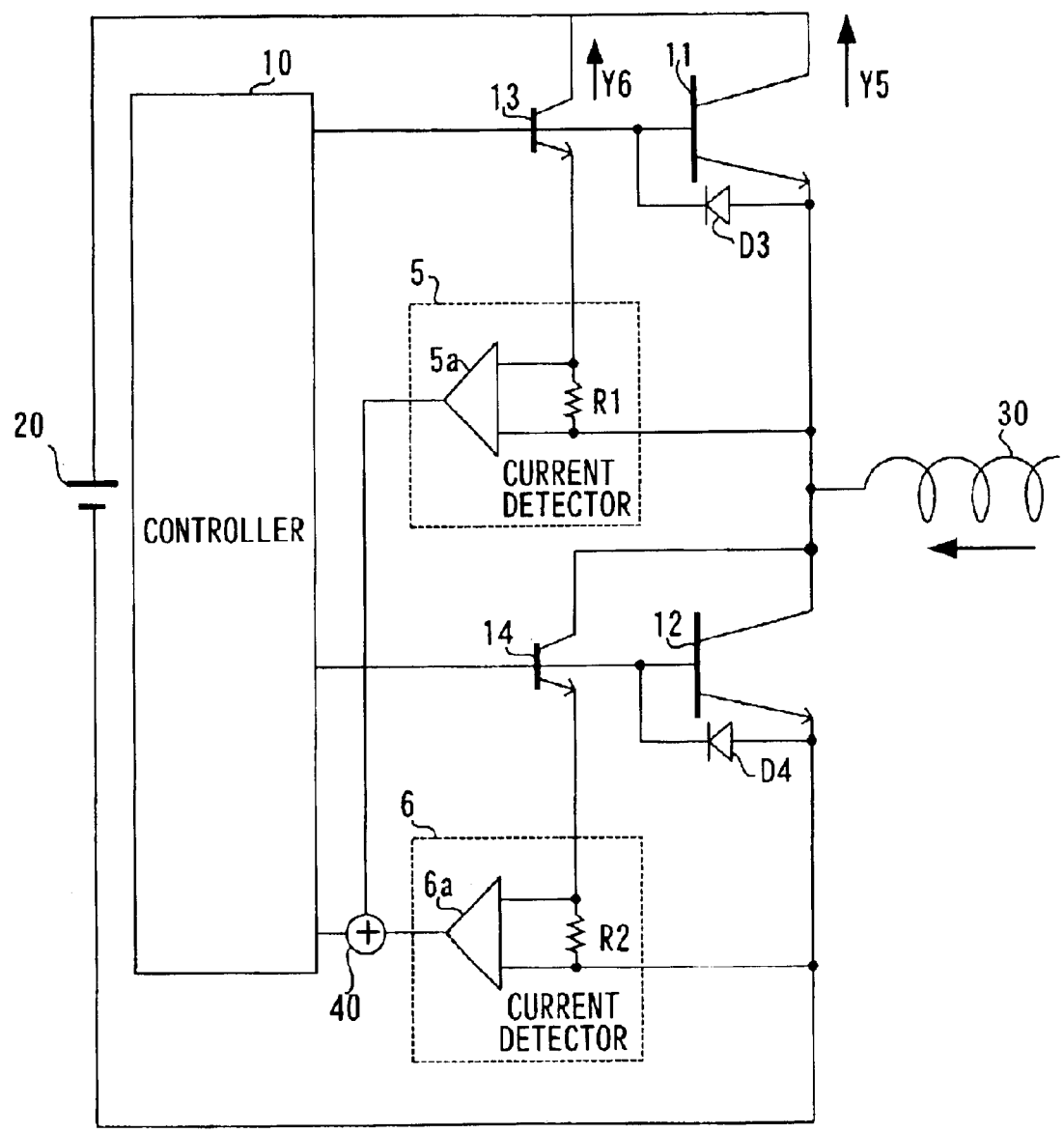
FIG. 4 is a figure showing the structure of a semiconductor device equipped with a current detection function according to the third preferred embodiment of the present invention.

FIG. 4 is a figure showing the structure of the third preferred embodiment of the semiconductor device equipped with a current detection function according to the present invention. This semiconductor device equipped with a current detection function according to the third preferred embodiment has the same structure as did the semiconductor device equipped with a current detection function according to the first preferred embodiment shown in FIG. 1, with the addition of an adder 40. In other words, the outputs of the current detector 5 and the current detector 6 are added together by the adder 40, and the result of this addition is inputted to the controller 10.

As described above, during the blanking time, reverse current only flows in the pair of transistors 11 and 13, or in the pair of transistors 12 and 14. Accordingly since, for example, no reverse current is flowing in the transistor 14 when reverse current is flowing in the transistor 13, at this time the result of adding together the outputs of the current detector 5 and the current detector 6 (the current detection result) agrees with the load current. In other words, the measured value of the load current comes to be inputted to the controller 10, in the same manner as with the semiconductor device equipped with a current detection function according to the first preferred embodiment shown in FIG. 1.

Thus, according to this semiconductor device equipped with a current detection function according to the third preferred embodiment, it is possible to reduce the number of input terminals upon the controller 10 for inputting the results of measuring the load current. In other words, it is possible to reduce the cost of the parts used for the interface portion with the controller 10, since it is possible to simplify this interface.

The Fourth Preferred Embodiment

Figure 5:
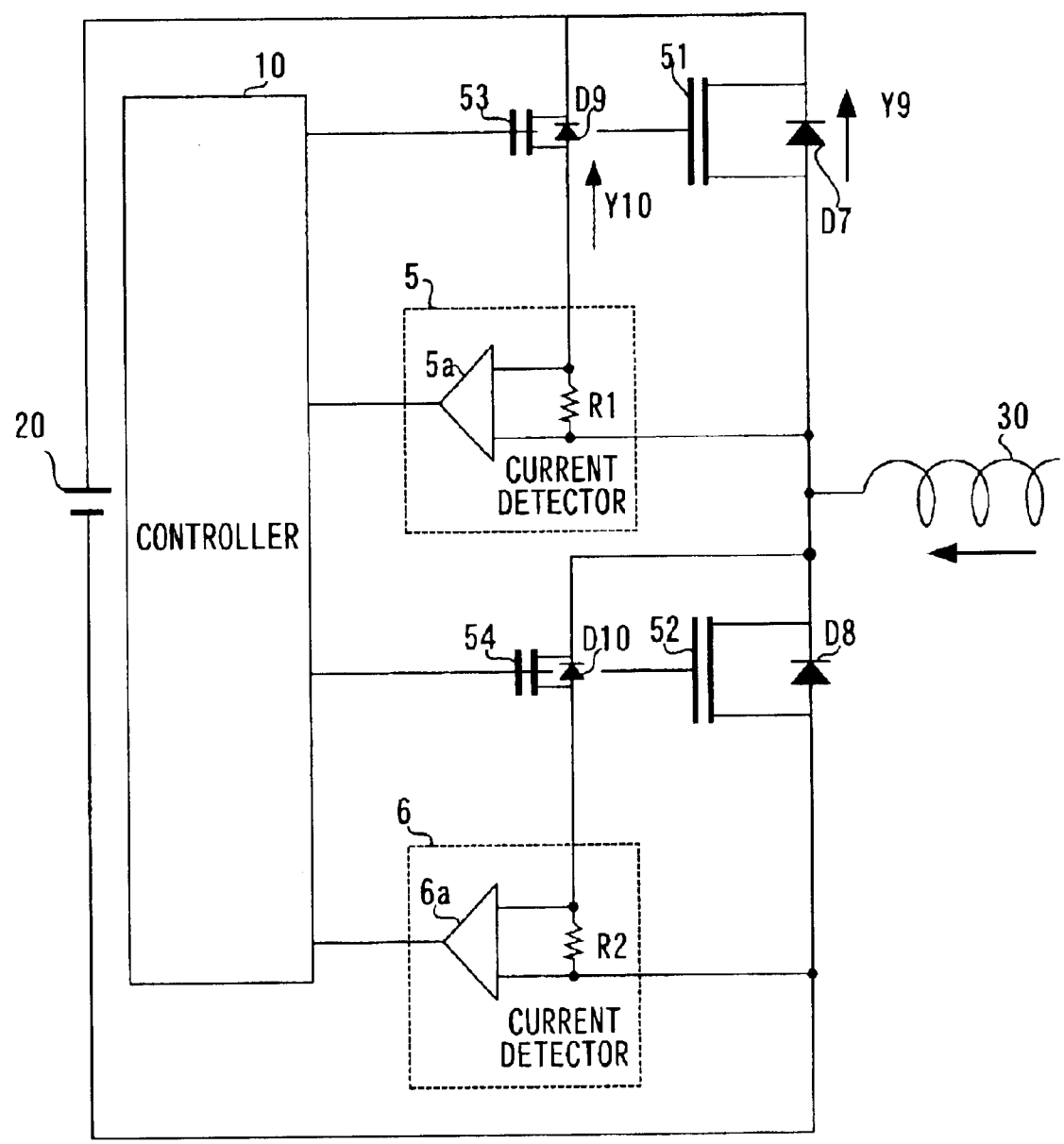
FIG. 5 is a figure showing the structure of a semiconductor device equipped with a current detection function according to the fourth preferred embodiment of the present invention.

FIG. 5 is a figure showing the structure of the fourth preferred embodiment of the semiconductor device equipped with a current detection function according to the present invention. With this semiconductor device equipped with a current detection function of the fourth preferred embodiment, MOS type power transistors 51, 52, 53, and 54 are used as the power transistors. As shown in FIG. 5, body diodes D7, D8, D9 and D10 are used for flowing reverse currents in the MOS type power transistors 51, 52, 53, and 54, respectively.

During the above described blanking time, the load current flows as reverse current in the body diodes D7 and D9, or in the body diodes D8 and D10. For example when, from the state in which the transistor 51 is OFF and the transistor 52 is ON, the transistor 52 is turned OFF by the controller 10, the load current flows in the body diodes D7 and D9. In other words, in the same manner as with the semiconductor device equipped with a current detection function of the first through the third preferred embodiments of the present invention, it is possible accurately to detect the load current during the blanking time by detecting, with the current detector 5 or 6 respectively, the reverse current which flows in the body diode D9 or the body diode D10, which are respectively provided at the MOS type power transistors 53 or 54 which are current mirrors.

The Fifth Preferred Embodiment

Figure 6:
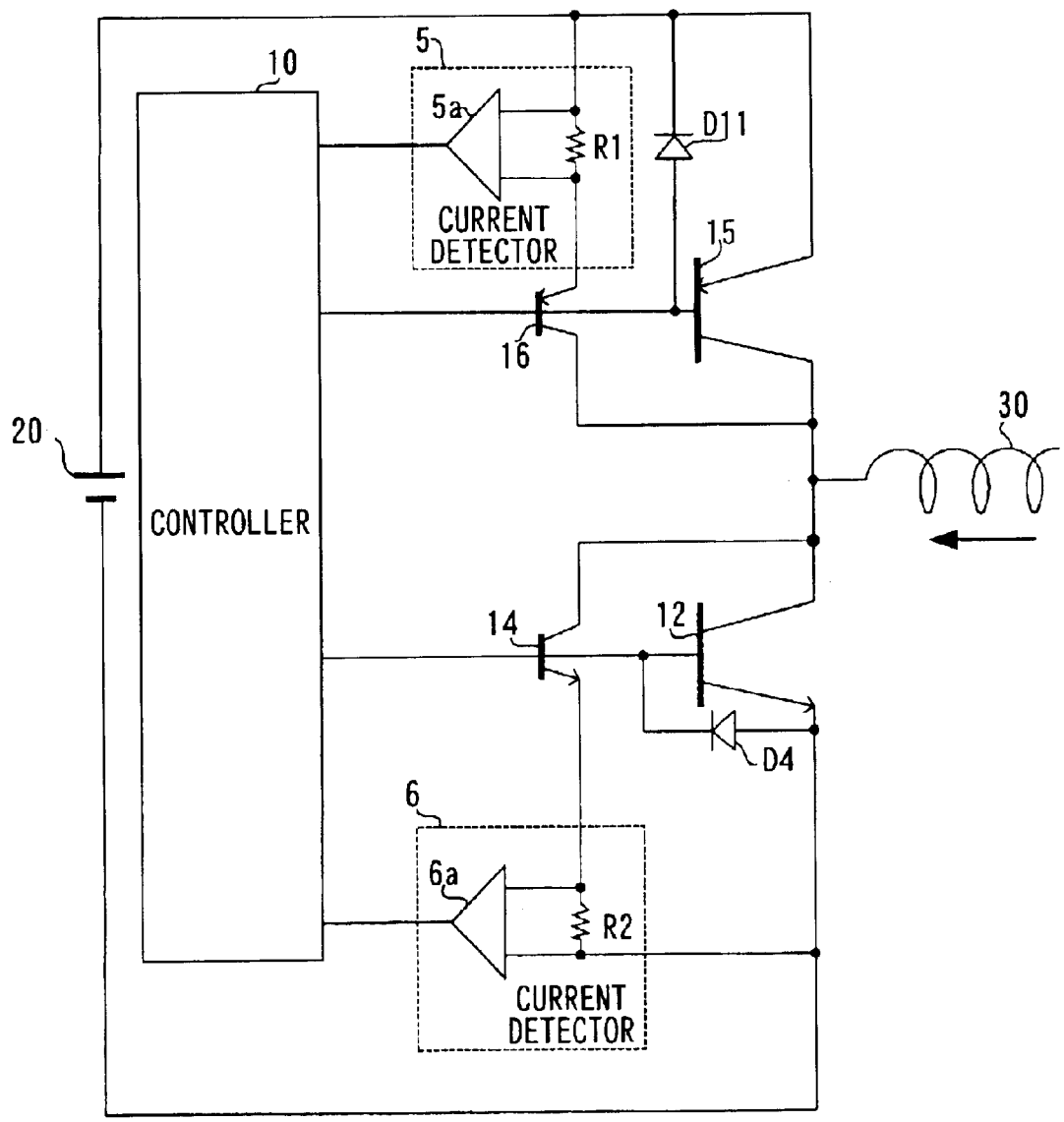
FIG. 6 is a figure showing the structure of a semiconductor device equipped with a current detection function according to the fifth preferred embodiment of the present invention.

FIG. 6 is a figure showing the structure of the fifth preferred embodiment of the semiconductor device equipped with a current detection function according to the present invention. This semiconductor device equipped with a current detection function according to the fifth preferred embodiment is one in which the present invention is applied to a push-pull type complementary switching circuit. The structures of the transistor 12 which constitutes the lower arm and of the transistor 14 which constitutes its current mirror are the same as their structures in semiconductor devices according to the first through the third preferred embodiments of this invention. On the other hand, PNP type bipolar transistors are used for a transistor 15 which constitutes the upper arm and a transistor 16 which constitutes its current mirror.

A diode D11 is connected between the base terminal and the emitter terminal of the transistor 15, in the direction to allow current to flow from the base terminal towards the emitter terminal. According to this structure, in the same manner as with the semiconductor devices according to the first through the fourth preferred embodiments of the present invention described above, when, from the state in which one of the transistors is ON and the other of the transistors is OFF, the transistor which was ON is turned OFF, reverse current flows in the transistor which maintains OFF. In other words, with this semiconductor device equipped with a current detection function according to the fifth preferred embodiment as well, it is possible accurately to detect the load current during the blanking time by detecting, with the current detector 5 or 6, the reverse current which flows in the transistor 14 or 16 which constitute the current mirrors.

The above described embodiments are examples, and various modifications can be made without departing from the spirit and scope of the invention. For example although, in the above described examples in which bipolar type power transistors are used as the power transistors, the diodes D3 and D4 are respectively provided for allowing reverse currents to flow by turning on the transistors 11 through 14 in their reverse directions, it would also be possible, as an alternative, not to provide these diodes D3 and D4. In other words, the present invention is not to be considered as being limited by the above described structures for allowing reverse current to flow by turning on the power transistors in their reverse directions; other different circuit structures or means for allowing such reverse current to flow may be applied to this semiconductor device.

Furthermore although, in the preferred embodiments described above, for the measurement of the load currents, the reverse currents which flow in the current mirrors are detected by using the resistors for current detection R1 and R2, it would also be possible, as alternatives, to utilize current amps or Hall sensors or the like for this purpose.

The disclosure of the following priority application is herein incorporated by reference: Japanese Patent Application No. 2002-98750, filed Apr. 1, 2002.

What is claimed is:

1. A semiconductor device equipped with a current detection function, comprising:
   a first power transistor which is positioned in an upper arm side with respect to an inductive load and which supplies drive current in a first direction;
   a first current adjustment device which causes current to flow in a direction opposite to the first direction with respect to the first power transistor;
   a first current mirror circuit through which a current flows that is proportional to the current flowing through the first power transistor;
   a first current detection device which detects the current flowing in the reverse direction to the first direction through the first current mirror circuit;
   a second power transistor, connected in series with the first power transistor, which is positioned in a lower arm side with respect to the inductive load and which supplies drive current in a second direction which is different from the first direction;
   a second current adjustment device which causes current to flow in a direction opposite to the second direction with respect to the second power transistor;
   a second current mirror circuit through which a current flows that is proportional to the current flowing through the second power transistor;
   a second current detection device which detects the current flowing in the reverse direction to the second direction through the second current mirror circuit; and
   a drive device which drives the first power transistor and the second power transistor respectively, wherein:
      while the first power transistor and the second power transistor are both being controlled to be OFF by the drive device, the current which flows through the inductive load is detected based upon the reverse direction current which is detected by at least one of the first current detection device and the second current detection device.

2. A semiconductor device equipped with a current detection function according to claim 1, wherein:
   when, from the state in which the first power transistor is being controlled to be OFF and also the second power transistor is being controlled to be ON by the drive device, the second power transistor is controlled to be OFF, the current which flows in the inductive load is detected based upon the reverse direction current which is detected by the first current detection device.

3. A semiconductor device equipped with a current detection function according to claim 1, wherein:
   when, from the state in which the first power transistor is being controlled to be ON and also the second power transistor is being controlled to be OFF by the drive device, the first power transistor is controlled to be OFF, the current which flows in the inductive load is detected based upon the reverse direction current which is detected by the second current detection device.

4. A semiconductor device equipped with a current detection function according to claim 1, wherein:
   the first current mirror circuit and the second current mirror circuit function as current control circuits which control the amounts of current which flow in the first power transistor and in the second power transistor by respectively detecting the currents which flows in the first direction and the second direction.

5. A semiconductor device equipped with a current detection function according to claim 1, further comprising:
   an adding device which adds together the output of the first current detection device and the output of the second current detection device, wherein:
      the result of addition calculated by the adding device is detected as the current which flows in the inductive load.

6. A semiconductor device equipped with a current detection function according to claim 1, wherein:
   the first current adjustment device supplies current due to a back electromotive force which is generated at the inductive load to a control terminal of the first power transistor so as to turn the first power transistor ON in the reverse direction to the direction which drives the inductive load, and the second current adjustment device supplies current due to a back electromotive force which is generated at the inductive load to a control terminal of the second power transistor so as to turn the second power transistor ON in the reverse direction to the direction which drives the inductive load.

7. A semiconductor device equipped with a current detection function according to claim 1, wherein:
   the first power transistor and the second power transistor are bipolar type power transistors.

8. A semiconductor device equipped with a current detection function according to claim 1, wherein:
   the first power transistor and the second power transistor are MOS type power transistors.

9. A semiconductor device equipped with a current detection function, comprising:
   a first power transistor which is positioned in an upper arm side with respect to an inductive load and which supplies drive current in a first direction;
   a first current adjustment means for causing current to flow in a direction opposite to the first direction with respect to the first power transistor;
   a first current mirror circuit through which a current flows that is proportional to the current flowing in the first power transistor;

a first current detection means for detecting the current flowing in the reverse direction to the first direction through the first current mirror circuit;

a second power transistor, connected in series with the first power transistor which is positioned in a lower arm side with respect to the inductive load and which supplies drive current in a second direction which is different from the first direction;

a second current adjustment means for causing current to flow in a direction opposite to the second direction with respect to the second power transistor;

a second current mirror circuit through which a current flows that is proportional to the current flowing in the second power transistor;

a second current detection means for detecting the current flowing in the reverse direction to the second direction through the second current mirror circuit; and a drive means for driving the first power transistor and the second power transistor, wherein:

while the first power transistor and the second power transistor are both being controlled to be OFF by the drive means, the current which flows in the inductive load is detected based upon the reverse direction current which is detected by at least one of the first current detection means and the second current detection means.

* * * * *